United States Patent
Chen

(10) Patent No.: US 8,400,211 B2
(45) Date of Patent: Mar. 19, 2013

(54) INTEGRATED CIRCUITS WITH REDUCED VOLTAGE ACROSS GATE DIELECTRIC AND OPERATING METHODS THEREOF

(75) Inventor: Chung-Hui Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 92 days.

(21) Appl. No.: 13/028,790

(22) Filed: Feb. 16, 2011

(65) Prior Publication Data

US 2012/0092066 A1 Apr. 19, 2012

Related U.S. Application Data

(60) Provisional application No. 61/393,542, filed on Oct. 15, 2010.

(51) Int. Cl.
*G05F 1/10* (2006.01)
(52) U.S. Cl. .......................... 327/535; 327/108
(58) Field of Classification Search ........... 327/534–535
See application file for complete search history.

(56) References Cited

U.S. PATENT DOCUMENTS

| | | | | |
|---|---|---|---|---|
| 3,947,727 A | * | 3/1976 | Stewart | 361/91.5 |
| 5,422,591 A | * | 6/1995 | Rastegar et al. | 327/409 |
| 5,689,144 A | * | 11/1997 | Williams | 307/130 |
| 5,831,313 A | * | 11/1998 | Han et al. | 257/371 |
| 5,877,635 A | * | 3/1999 | Lin | 326/83 |
| 5,886,487 A | * | 3/1999 | Khayat et al. | 318/400.27 |
| 5,892,387 A | * | 4/1999 | Shigehara et al. | 327/537 |
| 5,903,179 A | * | 5/1999 | Kim | 327/309 |
| 5,946,243 A | * | 8/1999 | Sim | 365/189.11 |
| 5,959,472 A | * | 9/1999 | Nagamatsu et al. | 327/108 |
| 5,972,745 A | * | 10/1999 | Kalter et al. | 438/220 |
| 6,144,257 A | * | 11/2000 | Bouras et al. | 330/277 |
| 6,369,994 B1 | * | 4/2002 | Voldman | 361/56 |
| 6,433,983 B1 | * | 8/2002 | Fechner | 361/111 |
| 6,529,180 B1 | * | 3/2003 | Ito et al. | 345/89 |
| 6,611,157 B2 | * | 8/2003 | Usui | 327/112 |
| 6,750,527 B1 | * | 6/2004 | Momohara | 257/511 |
| 7,230,810 B1 | * | 6/2007 | Andrews et al. | 361/91.1 |
| 7,746,121 B2 | * | 6/2010 | Khoury et al. | 327/108 |
| 7,800,405 B2 | * | 9/2010 | Lee et al. | 326/41 |
| 7,855,862 B1 | * | 12/2010 | Gallagher et al. | 361/56 |
| 7,990,178 B2 | * | 8/2011 | Liu et al. | 326/83 |
| 7,999,327 B2 | * | 8/2011 | Kitahara | 257/371 |
| 2004/0190209 A1 | * | 9/2004 | Jozwiak et al. | 361/56 |
| 2009/0091870 A1 | * | 4/2009 | Huang et al. | 361/56 |

* cited by examiner

*Primary Examiner* — Thomas J Hiltunen
(74) *Attorney, Agent, or Firm* — Lowe Hauptman Ham & Berner, LLP

(57) ABSTRACT

An integrated circuit includes a first pass gate and a first receiver electrically coupled with the first pass gate. The first receiver includes a first N-type transistor. A first gate of the first N-type transistor is electrically coupled with the first pass gate. A first P-type bulk of the first N-type transistor is surrounded by a first N-type doped region. The first N-type doped region is surrounded by a first N-type well. The first N-type doped region has a dopant concentration higher than that of the first N-type well.

18 Claims, 9 Drawing Sheets

INTEGRATED CIRCUITS WITH REDUCED VOLTAGE ACROSS GATE DIELECTRIC AND OPERATING METHODS THEREOF

CROSS-REFERENCE TO RELATED APPLICATIONS

The present application claims priority of U.S. Provisional Patent Application Ser. No. 61/393,542, filed on Oct. 15, 2010, which is incorporated herein by reference in its entirety.

FIELD OF THE DISCLOSURE

The present disclosure relates generally to the field of semiconductor circuits, and more particularly, to integrated circuits including a charge pump circuit and operating methods thereof.

BACKGROUND OF THE DISCLOSURE

Differential signaling has been utilized for many years as a data transmission method. A differential receiver converts and amplifies a differential input signal ($V_{IN}^+$ and $V_{IN}^-$) to a differential output signal ($V_{OUT}^+$ and $V_{OUT}^-$). These receivers offer high data transmission speeds, low noise coupling, and low EMI (electromagnetic interference). Teletype equipment was some of the first types of equipment to use differential signaling to communicate. Today, computers often communicate between ports by low voltage differential signal (LVDS) drivers and receiver pairs. In addition to the LVDS data transmission technology, emitter coupled logic (ECL), common mode logic (CML), and hyper-transport (high-bandwidth chip-to-chip technology) technology are utilized for data transmission methods. Typical differential signal transmission speeds are over 100 Mbps (mega bits per second). In each of these transmission methods, high speed, wide common mode, voltage differential receivers are necessary building blocks to attain the required data transmission speeds while meeting the low noise coupling, and the low EMI requirements.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
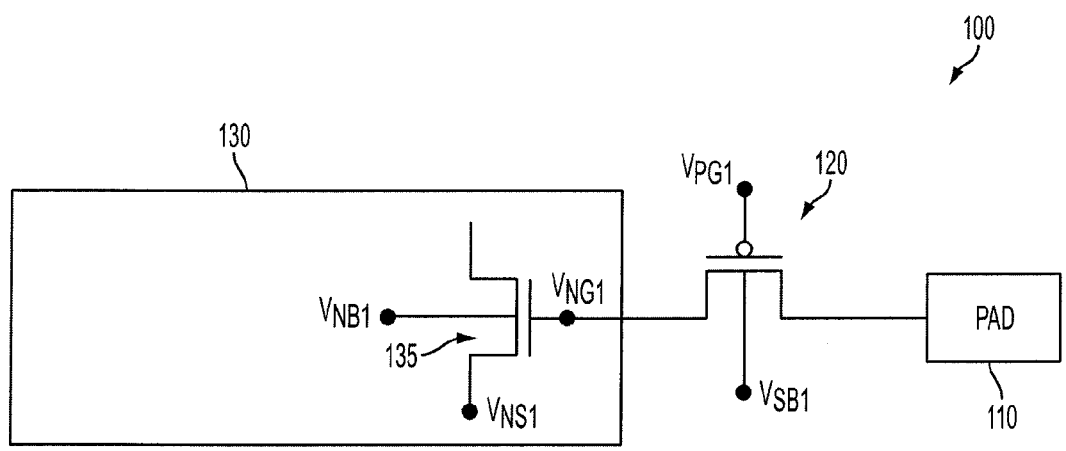
FIG. 1 is a schematic drawing illustrating an exemplary integrated circuit including a receiver.

Generally, when technology nodes shrink, gate dielectric thicknesses become thinner. Low voltages are applied to receivers due to the thin gate dielectrics. High input voltages, however, may still be applied to the receivers to achieve high-speed and/or analog operations. The high input voltages, however, could damage the thin gate dielectrics of transistors in the receivers. Though different dielectric thicknesses may be formed for transistors operated under different input voltages, the process of forming dual or multiple gate dielectric thicknesses for the receivers is complicated.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary integrated circuit including a receiver. In FIG. 1, an integrated circuit 100 can include a pass gate 120 electrically coupled with a pad 110. The integrated circuit 100 can include a receiver 130 that is electrically coupled with the pass gate 120. In some embodiments, the integrated circuit 100 can be a double date rate (DDR) circuit, a low voltage differential signal (LVDS) circuit, or any other high-speed analog circuit.

Referring to FIG. 1, the receiver 130 can include at least one N-type transistor, e.g., an N-type transistor 135. A gate of the N-type transistor 135 can be electrically coupled with the pass gate 120. The gate of the N-type transistor 135 can be configured to receive a voltage $V_{NG1}$. The N-type transistor 135 can include a P-type bulk that can be configured to receive a voltage $V_{NB1}$. A voltage difference between the voltage $V_{NG1}$ and the voltage $V_{NB1}$ can be free from substantially overstressing a gate dielectric of the N-type transistor 135.

For example, the gate dielectric of the N-type transistor 135 is made by a 20-nm technology node and can sustain a voltage level of around 2 V or below. If a high voltage, e.g., 2.5 V or higher, were applied to the gate of the N-type transistor 135 from the pad 110 and the bulk of the N-type transistor 135 were grounded, the gate dielectric of the N-type transistor 135 would be overstressed and damaged. In some embodiments, the voltage $V_{NB1}$ that is applied to the P-type bulk of the N-type transistor 135 is pulled up above 0 V, such that the voltage difference between the voltages $V_{NG1}$ and $V_{NB1}$ is about 1.92 V or lower. In other embodiments, the voltage $V_{NB1}$ can be around 0.85 V or more. The low voltage difference between the gate and bulk of the N-type transistor 135 can substantially avoid overstressing the gate dielectric of the N-type transistor 135. By raising the bulk voltage of the N-type transistor 135, the gate dielectric of the N-type transistor can sustain under the high-power voltage, e.g., 2.5 V, operation. It is noted that the voltage levels and technology node described above are merely exemplary. The voltage levels may vary in response to the change of the technology node.

In some embodiments, the voltage $V_{NG1}$ can be modified by using the pass gate 120. For example, the pass gate 120 is a P-type transistor having a threshold voltage of about −0.35 V. A voltage $V_{PG1}$ is applied to turn on the P-type transistor. In some embodiments, the voltage $V_{PG1}$ of about 0.85 V is applied to the gate of the P-type transistor and a voltage of about 2.5 V is applied to the pad 110. By using the pass gate 120, the voltage $V_{NG1}$ that is applied to the gate of the N-type transistor 135 can vary ranging from about 2.5 V to about 1.2 V. By reducing the voltage level passed from the pad 110, the gate dielectric of the N-type transistor 135 can be desirably free from being overstressed.

In some embodiments, the bulk of the pass gate 120 is configured to receive a voltage $V_{SB1}$ such that the bulk of the pass gate 120 is free from being short to the pad 110. The voltage difference between the voltages $V_{PG1}$ and $V_{SB1}$ is free from substantially overstressing the gate dielectric of the pass gate 120. In other embodiments, the bulk and source of the pass gate 120 are reverse biased. In still other embodiments, the bulk and drain of the pass gate 120 are reverse biased.

Figure 2:
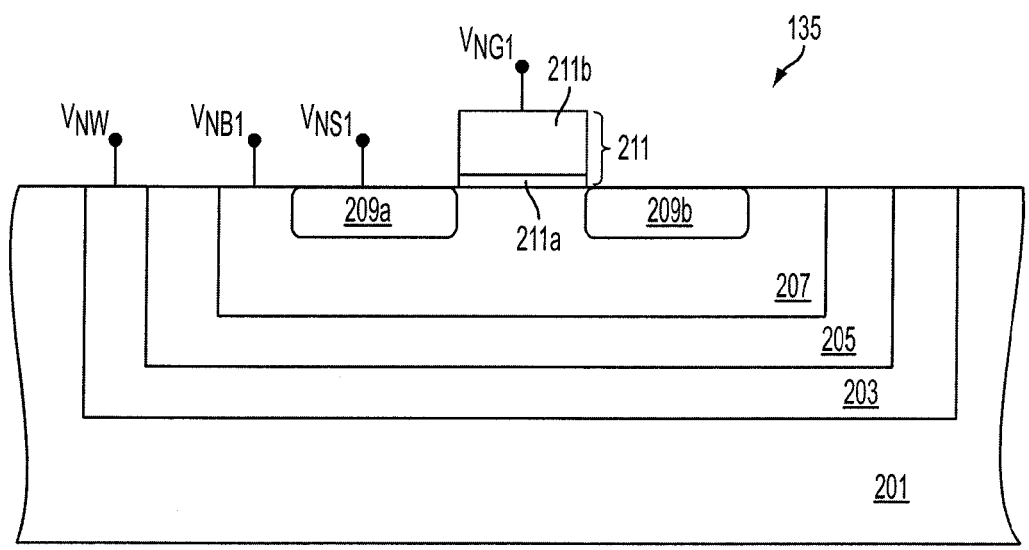
FIG. 2 is a schematic cross-sectional view illustrating an exemplary N-type transistor.

FIG. 2 is a schematic cross-sectional view illustrating an exemplary N-type transistor. In FIG. 2, an N-type well 203 can be disposed in a P-type substrate 201 doped with a P-type dopant, such as boron. In some embodiments, the P-type substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the P-type substrate 201 could include an epitaxial layer (epi layer), may be strained for performance enhancement, and may include a silicon-on-insulator (SOI) structure.

Referring to FIG. 2, an N-type doped region 205 can be surrounded by the N-type well 203. The N-type well 203 and the N-type doped region 205 can be doped with an N-type dopant, such as phosphorus (P) and/or arsenic (As). The N-type doped region 205 can have a dopant concentration, which is higher than that of the N-type well 203. In some embodiments, the N-type doped region 205 can be referred to as an N-type deep well.

Referring again to FIG. 2, a P-type bulk region 207 of the N-type transistor 135 can be surrounded by the N-type doped region 205. The N-type transistor 135 can include a source 209a, a drain 209b, and a gate structure 211. The gate structure 211 is configured to receive the voltage $V_{NG1}$, the source 209 is configured to receive the voltage $V_{NS1}$, the P-type bulk 207 is configured to receive the voltage $V_{NB1}$, and the N-type well 203 is configured to receive a voltage $V_{NW}$.

In some embodiments, the gate structure 211 can be a conductive gate structure, e.g., a polysilicon gate structure, a metal gate structure, or any suitable gate structure. For example, a conductive gate structure can have a stack structure including a gate dielectric layer (e.g., 211a in FIG. 2), a conductive material layer (e.g., 211b in FIG. 2), and/or other suitable layers. A metal gate structure can have a stack structure including a high dielectric constant (high-k) gate layer, a diffusion barrier layer, a metal work function layer, a metallic layer, and/or other suitable layers.

As noted, the P-type bulk 207 can be configured to receive the voltage $V_{NB1}$ that is higher than 0, such that the voltage difference between the voltages $V_{NG1}$ and $V_{NB1}$ is free from substantially overstressing the gate dielectric of the N-type transistor 135. It is also noted that the N-type doped region 205 has a high dopant concentration and surrounds the P-type bulk 207. By using the N-type doped region 205, the voltage $V_{NB1}$ can be pulled up to a higher voltage level, such that the voltage difference between the voltage $V_{NG1}$ and $V_{NB1}$ is free from substantially overstressing the gate dielectric of the N-type transistor 135.

Figure 3:
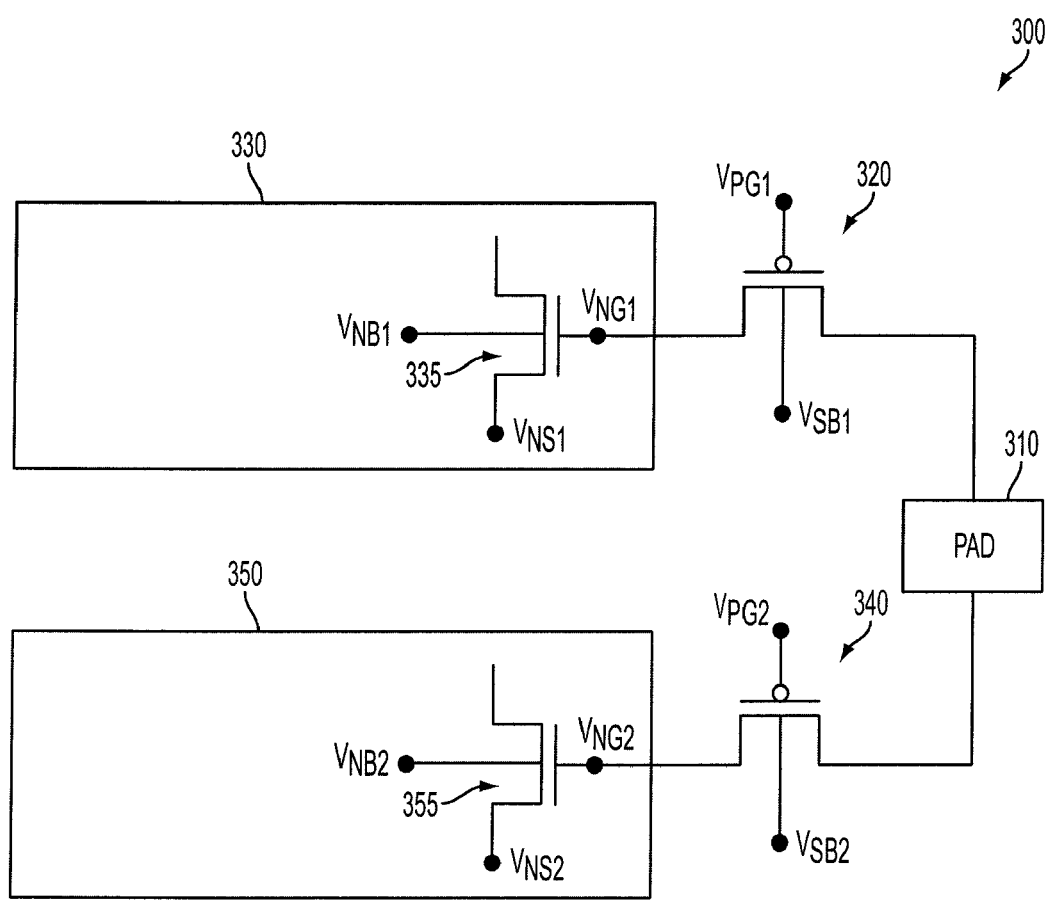
FIG. 3 is a schematic drawing illustrating an exemplary integrated circuit including a high-side receiver and a low-side receiver.

FIG. 3 is a schematic drawing illustrating an exemplary integrated circuit including a high-side receiver and a low-side receiver. Items of FIG. 3 that are the same items in FIG. 1 are indicated by the same reference numerals, increased by 200. In FIG. 3, an integrated circuit 300 can include pass gates 320 and 340. The pass gates 320 and 340 can be electrically coupled with a pad 310. The pass gates 320 and 340 can be electrically coupled with receivers 330 and 350, respectively.

Referring to FIG. 3, the receiver 350 can include at least one N-type transistor, e.g., an N-type transistor 355. A gate of the N-type transistor 355 can be electrically coupled with the pass gate 340. The gate of the N-type transistor 355 can be configured to receive a voltage $V_{NG2}$. The N-type transistor 355 can include a P-type bulk that can be configured to receive a voltage $V_{NB2}$. A voltage difference between the voltages $V_{NG2}$ and $V_{NB2}$ is free from substantially overstressing a gate dielectric of the N-type transistor 355.

For example, the gate dielectric of the N-type transistor 355 is made by a 20-nm technology node and designed for a 1.5-V operation. If a high voltage, e.g., 1.9 V or higher, were applied to the gate of the N-type transistor 355 from the pad 310 and the bulk of the N-type transistor 355 were grounded, the gate dielectric of the N-type transistor 355 might be overstressed and damaged. In some embodiments, the voltage $V_{NB2}$ can be pulled up above 0 V, such that the voltage difference between the voltages $V_{NG2}$ and $V_{NB2}$ is about 1.92 V or lower. The low voltage difference between the gate and bulk of the N-type transistor 355 can substantially avoid overstressing the gate dielectric of the N-type transistor 355. It is noted that the voltage levels and the technology node described above are merely exemplary. The voltage levels may vary in response to the change of the technology node.

In some embodiments, the voltage $V_{NG2}$ can be modified by using the pass gate 340. For example, the pass gate 340 is an N-type transistor having a threshold voltage of about 0.3 V. A voltage $V_{PG2}$ of about 1.9 V is applied to turn on the N-type transistor. A voltage of about 0 V is applied to the pad 310. The voltage $V_{NG2}$ can vary ranging from about 0 V to about 1.6 V. By reducing the voltage level passed from the pad 310, the gate dielectric of the N-type transistor 335 can be desirably free from being overstressed.

In some embodiments, the bulk of the pass gate 340 is configured to receive a voltage $V_{SB2}$ such that the bulk of the pass gate 340 is free from being short to the pad 310. The voltage difference between the voltages $V_{PG2}$ and $V_{SB2}$ is free from substantially overstressing the gate dielectric of the pass gate 340. In other embodiments, the bulk and drain of the pass gate 340 are reverse biased. In still other embodiments, the bulk and source of the pass gate 120 are reverse biased.

In some embodiments, the integrated circuit 300 can include a single-end amplifier. The receiver 330 can be referred to as a high-side receiver and the receiver 350 can be referred to as a low-side receiver. For examples, the integrated circuit 300 can receive an input voltage of about 2.5 V. The high-side receiver can process and/or amplify signals with a common mode voltage of about 1.2 V or higher. The low-side receiver can process and/or amplify signals with a common mode voltage of about 1.2 V or lower. By selectively outputting the processed signals from the receivers 330 and 350, a high-speed and/or analog operation can be achieved.

Figure 4:
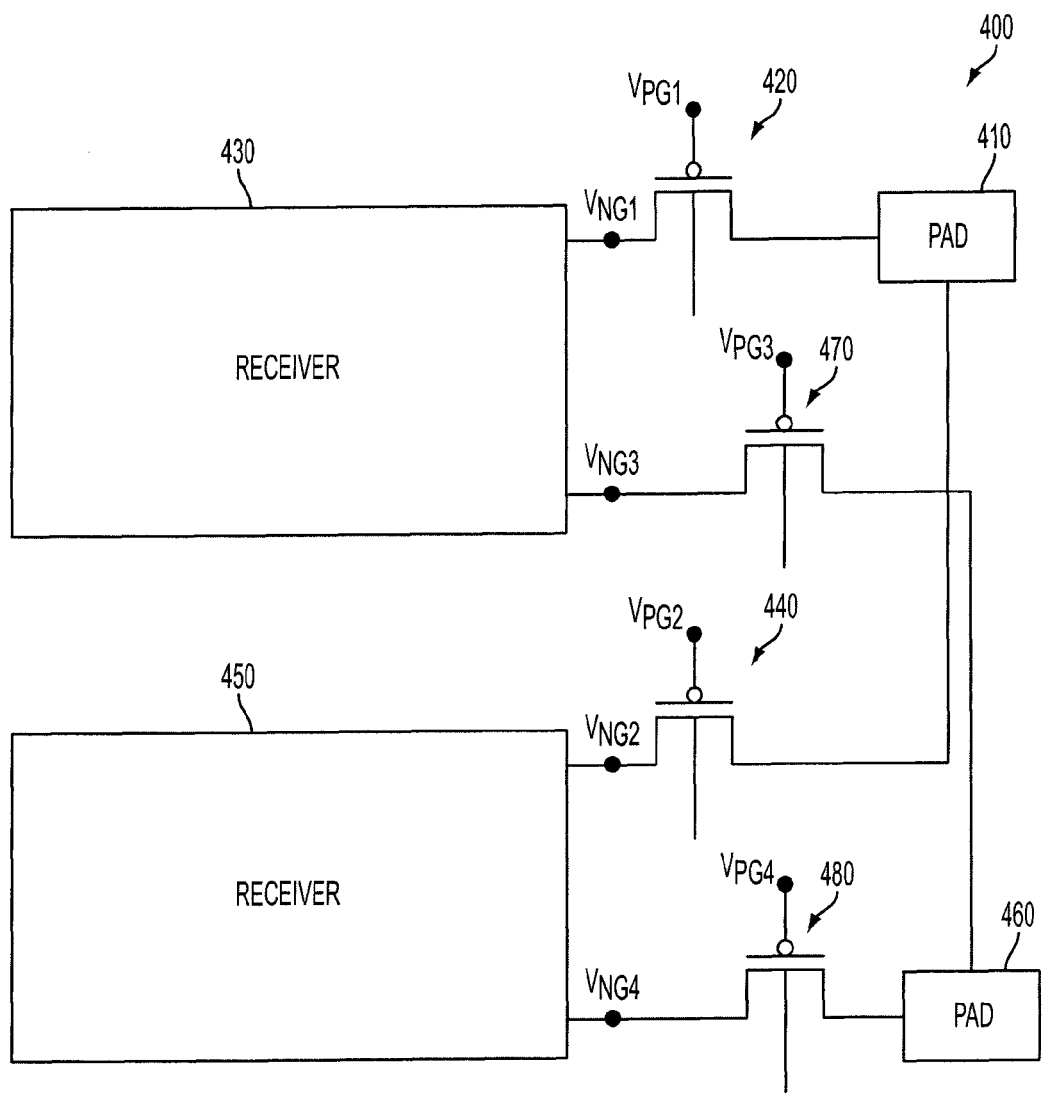
FIG. 4 is a schematic drawing illustrating another exemplary integrated circuit including a high-side receiver and a low-side receiver.

FIG. 4 is a schematic drawing illustrating another exemplary integrated circuit including a high-side receiver and a low-side receiver. Items of FIG. 4 that are the same items in FIG. 3 are indicated by the same reference numerals, increased by 100. In FIG. 4, an integrated circuit 400 can include pass gates 420, 440, 470, and 480. The pass gates 420 and 440 can be electrically coupled with a pad 410. The pass gates 470 and 480 can be electrically coupled with a pad 460. The pass gates 420 and 440 can be electrically coupled with receivers 430 and 450, respectively. The pass gates 470 and 480 can be electrically coupled with receivers 430 and 450, respectively.

In some embodiments, the pads 410 and 460 can receive input voltages ranging from about 0 V to about 2.5 V. The voltages $V_{PG1}$ and $V_{PG3}$ applied on gates of the pass gates 420 and 470 can be around 0.85 V. The voltages $V_{NG1}$ and $V_{NG3}$ received by the receiver 430 can range from about 1.2 V to about 2.5 V. The voltages $V_{PG2}$ and $V_{PG4}$ applied on gates of the pass gates 440 and 480 can be around 1.9 V. The voltages $V_{NG2}$ and $V_{NG4}$ received by the receiver 450 can range from about 0 V to about 1.6 V.

Figure 5:
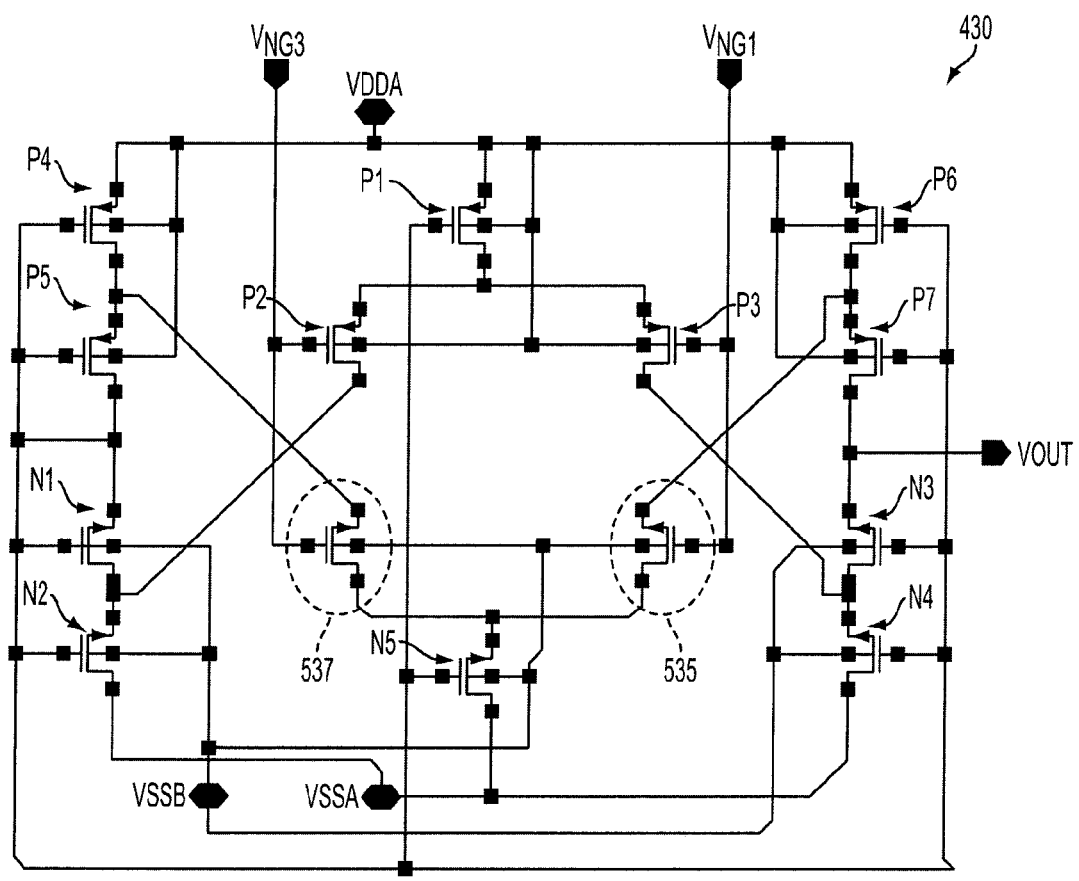
FIG. 5 is a schematic drawing illustrating an exemplary receiver.

FIG. 5 is a schematic drawing illustrating an exemplary receiver. In FIG. 5, the receiver 430 can be configured to receive the voltages $V_{NG1}$ and $V_{NG3}$. The voltages $V_{NG1}$ and $V_{NG3}$ can be applied to N-type transistors 535 and 537, respectively. In some embodiments, the N-type transistor 537 can be similar to the N-type transistor 535.

In some embodiments receiving input voltages ranging from about 0 V to 2.5 V, a voltage $V_{DDA}$, e.g., about 2.5 V, can be applied to bulks of P-type transistors P1-P7 and a voltage $V_{SSA}$, e.g., about 0.85 V, can be applied to sources of N-type transistors N2, N4, and N5. P-type bulks of the N-type transistors 535 and 537 can be configured to receive a voltage $V_{SSB}$, e.g., about 0.85 V. As noted, the voltages $V_{NG1}$ and $V_{NG3}$ applied on the gates of the N-type transistors 535 and 537 can range from about 1.2 V to about 2.5 V. The voltage difference between the P-type bulk and the gate of each N-type transistor is substantially reduced. The gate dielectric of each of the N-type transistors 535 and 537 can be substantially free from being overstressed, even if the gate dielectric of the N-type transistors 535 and 537 are made by a low-voltage technology node, e.g., 1.5-V technology node.

In some embodiments, the receiver 430 can include P-type transistors P1-P7 and N-type transistors N1-N5. The P-type transistor P1 and the N-type transistor N5 can be referred to as current tailors. The P-type transistor P2 can be electrically coupled with the N-type transistors N1-N2. The N-type transistor 537 can be electrically coupled with the P-type transistors P4-P5. The P-type transistor P3 can be electrically coupled with the N-type transistors N3-N4. The N-type transistor 535 can be electrically coupled with the P-type transistors P6-P7. In some embodiments, the P-type transistors P1-P7, N-type transistors N1-N5, and N-type transistors 535 and 537 can have the same gate dielectric thickness and/or formed by the same gate dielectric process. It is noted that the circuit of the receiver 430 shown in FIG. 5 is merely exemplary. Different configurations of the receiver 430 can be applied.

In some embodiments, the receiver 450 can have the configuration similar to that of the receiver 430 and serve as a low-side receiver. A voltage $V_{DDA}$, e.g., about 1.9 V, can be applied to bulks of P-type transistors P1-P7 and a voltage $V_{SSA}$, e.g., about 0 V, can be applied to sources of N-type transistors N2, N4, and N5. P-type bulks of the N-type transistors 535 and 537 can be configured to receive a voltage $V_{SSB}$, e.g., about 0 V. As noted, the voltages $V_{NG1}$ and $V_{NG3}$ applied on the gates of the N-type transistors 535 and 537 can range from about 0 V to about 1.6 V.

FIGS. 6A-6E are schematic drawings illustrating simulations of outputs from the integrated circuit 400 under different common mode voltages. In each of FIGS. 6A-6E, signals denoted with symbols (vin), (vin_), (voutI) and (vouth) are respectively received at PAD 460, PAD 410, the output of the low-side receiver 450, and the output of the high-side receiver 430. Specifically, in each of FIGS. 6A-6E, the input signals denoted with symbols (vin), (vin_) at PAD 460, PAD 410 are oscillating in opposite phases about the respective common mode voltage level.

Figure 6A:
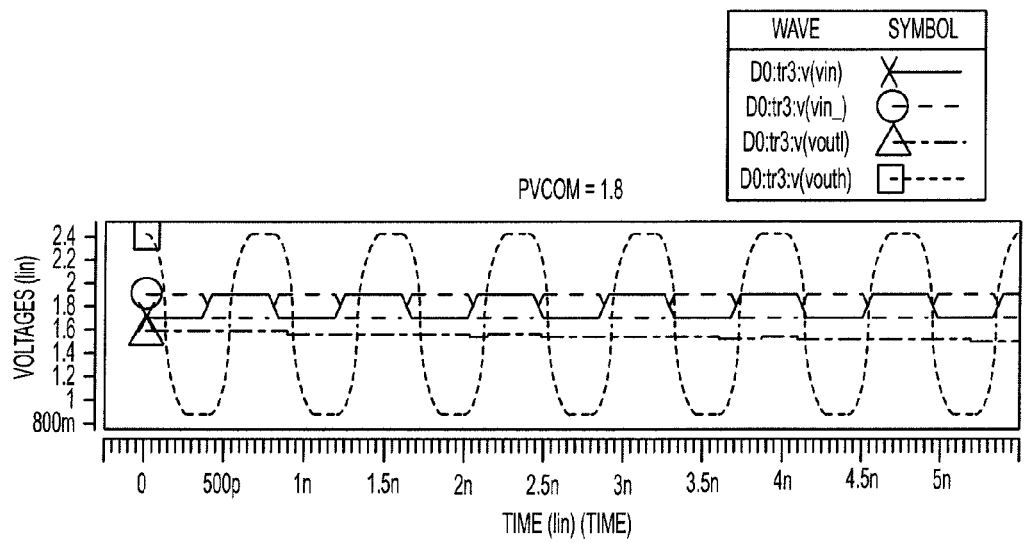
FIGS. 6A-6B are schematic drawings illustrating simulations of outputs from the integrated circuit 400 under different high common mode voltages.
Figure 6B:
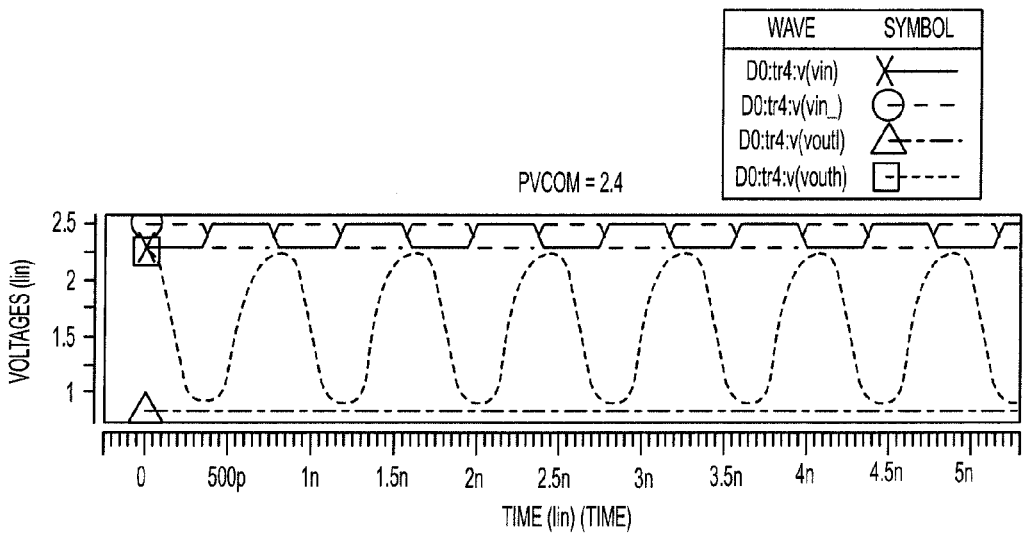

In FIG. 6A, if the common mode voltage is about 1.8 V, the receiver 430, e.g., a high-side receiver, can process the received signals and output signals oscillating in a range from about 2.4 V to about 0.9 V. In FIG. 6B, if the common mode voltage is about 2.4 V, the receiver 430, e.g., a high-side receiver, can process the received signals and output signals oscillating in a range from about 2.4 V to about 0.9 V. It should be noted that if the high input voltages, such as those in FIGS. 6A-6B, were directly applied to the receivers 430, 450 (e.g., at the gates of the N-type transistors 335, 355 in FIG. 3), the gate dielectrics of the N-type transistors 335, 355, which in this exemplary configuration can sustain a voltage level of around 1.5 V, may be damaged. However, by providing pass gates 420, 440, 470, and 480 and/or by bulk biasing the N-type transistors 335, 355 as disclosed above, the low voltage N-type transistors 335, 355 can operate at the high input voltages without being over-stressed.

Figure 6C:
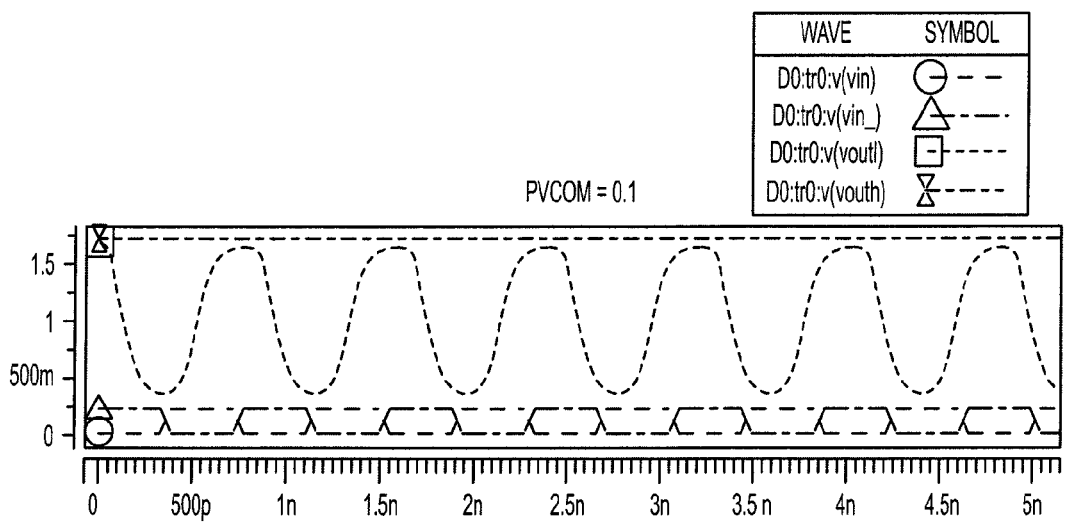
FIGS. 6C-6E are schematic drawings illustrating simulations of outputs from the integrated circuit 400 under different low common mode voltages.
Figure 6D:
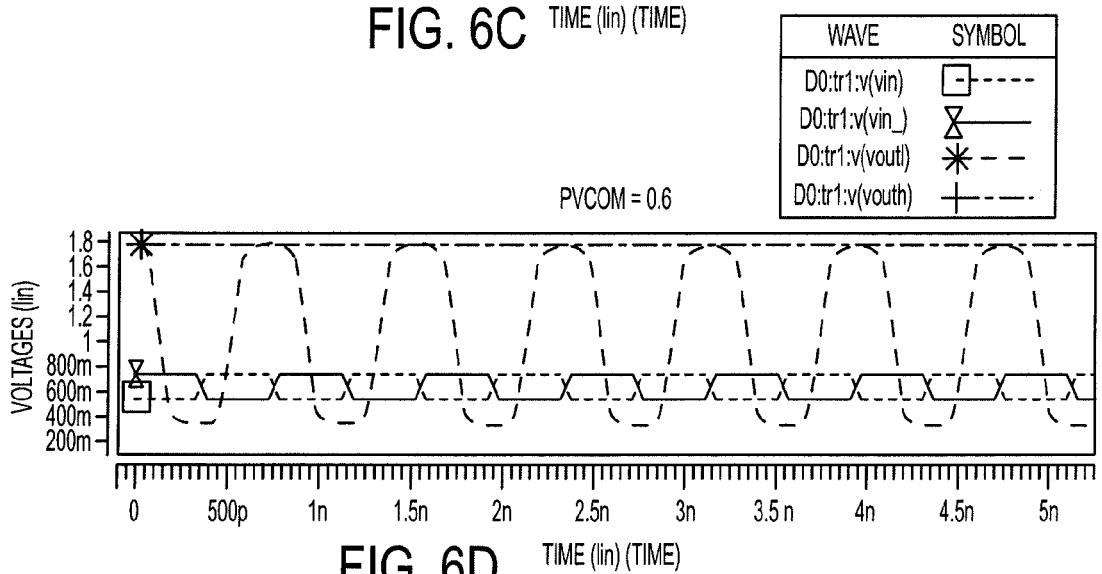
Figure 6E:
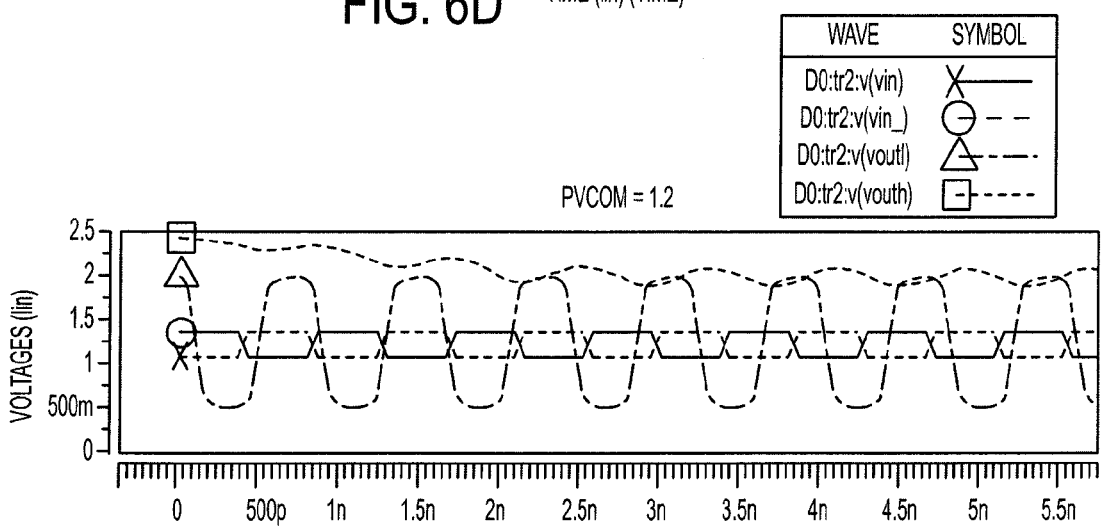

FIGS. 6C-6E are schematic drawings illustrating simulations of outputs from the integrated circuit 400 under different low common mode voltages. In FIG. 6C, if the common mode voltage is about 0.1 V, the receiver 450, e.g., a low-side receiver, can process the received signals and output signals oscillating in a range from about 1.6 V to about 0.2 V. In FIG. 6D, if the common mode voltage is about 0.6 V, the receiver 450, e.g., a low-side receiver, can process the received signals and output signals oscillating in a range from about 1.8 V to about 0.2 V. In FIG. 6E, if the common mode voltage is about 1.2 V, the receiver 450, e.g., a low-side receiver, can process the received signals and output signals oscillating in a range from about 1.8 V to about 0.2 V.

Figure 7:
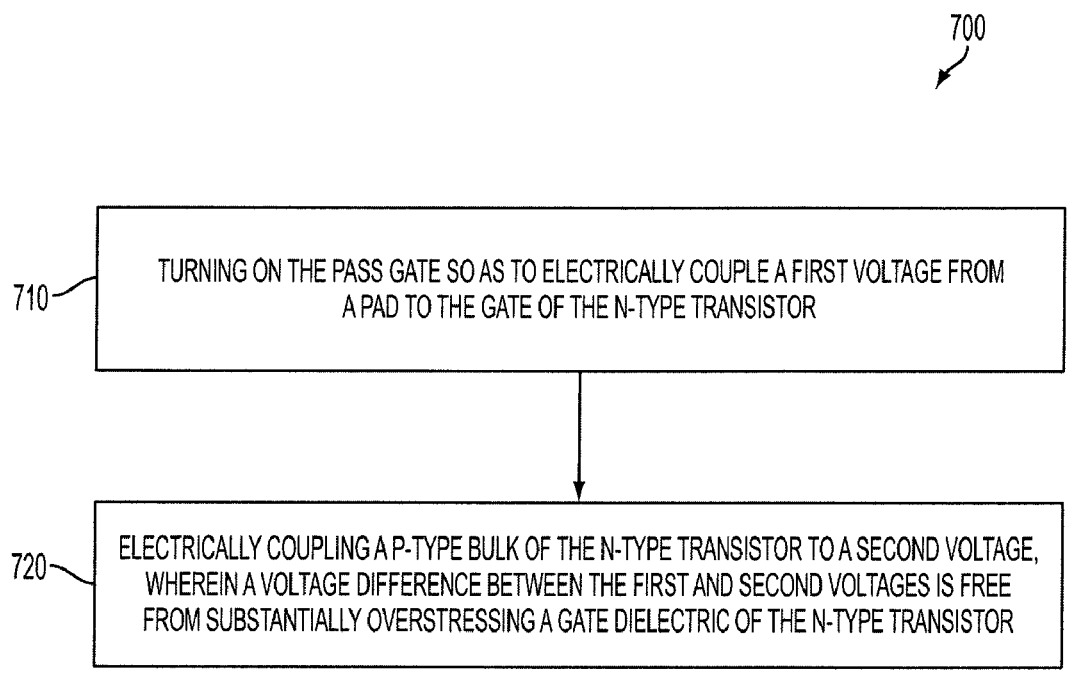
FIG. 7 is a schematic drawing illustrating an exemplary method of operating an integrated circuit.

FIG. 7 is a schematic drawing illustrating an exemplary method of operating an integrated circuit. Referring to FIGS. 3 and 7, the integrated circuit 300 can include a high-side receiver, e.g., the receiver 330, and a low-side receiver, e.g., the receiver 350. The high-side receiver 330 includes the N-type transistor 335. The gate of the N-type transistor 335 is electrically coupled with the pass gate 320. The method 700 comprises turning on the pass gate 320 so as to electrically couple the voltage $V_{NG1}$ from the pad 310 to the gate of the N-type transistor 335 (Step 710). The method 700 can include electrically coupling the P-type bulk of the N-type transistor 335 to a voltage $V_{NB1}$, wherein a voltage difference between the voltages $V_{NG1}$ and $V_{NB1}$ is free from substantially overstressing a gate dielectric of the N-type transistor 335. In some embodiments, the voltage $V_{NB1}$ is larger than 0 V. In other embodiments operating under 2.5 V, the voltage $V_{NB1}$ can be around 0.85 V.

In some embodiments, the method 700 can include electrically coupling a source of the N-type transistor 335 to a voltage $V_{NS1}$, wherein the voltage $V_{NS1}$ is higher than 0 V and a voltage difference between the voltages $V_{NG1}$ and $V_{NS1}$ is free from substantially overstressing the gate dielectric of the N-type transistor 335. In other embodiments, the method 700 can include electrically coupling a bulk of the pass gate 320 to a voltage $V_{SB1}$, such that the bulk of the pass gate 320 is free from being short to the pad 310.

Figure 8:
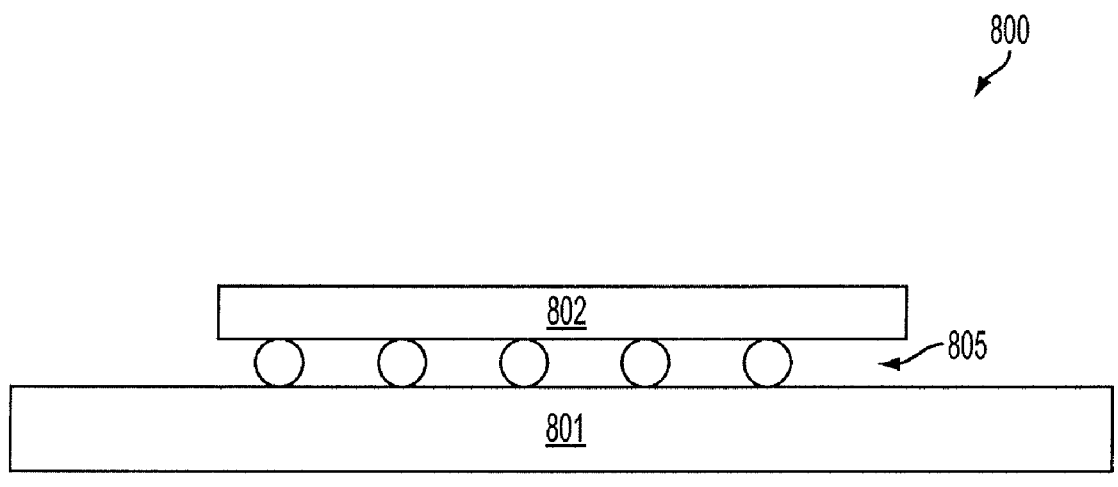
FIG. 8 is a schematic drawing illustrating a system including an exemplary integrated circuit disposed over a substrate board.

FIG. 8 is a schematic drawing illustrating a system including an exemplary integrated circuit disposed over a substrate board. In FIG. 8, a system 800 can include an integrated circuit 802 disposed over a substrate board 801. The substrate board 801 can include a printed circuit board (PCB), a printed wiring board and/or other carrier that is capable of carrying an integrated circuit. The integrated circuit 802 can be similar to one or more of the integrated circuits 100, 300, and 400 described above in conjunction with FIGS. 1, 3, and 4, respectively. The integrated circuit 802 can be electrically coupled with the substrate board 801. In some embodiments, the integrated circuit 802 can be electrically coupled with the substrate board 801 through bumps 805. In other embodiments, the integrated circuit 802 can be electrically coupled with the substrate board 801 through wire bonding. The system 800 can be part of an electronic system such as computers, wireless communication devices, computer-related peripherals, entertainment devices, or the like.

In embodiments, the system 800 including the integrated circuit 802 can provides an entire system in one IC, so-called system on a chip (SOC) or system on integrated circuit (SOIC) devices. These SOC devices may provide, for example, all of the circuitry needed to implement a radio system, a television, a video apparatus, a satellite broadcast system, an instrumentation system, a cell phone, personal data assistant (PDA), digital VCR, digital camcorder, digital camera, MP3 player, or the like in a single integrated circuit.

From the foregoing description, in a first embodiment, an integrated circuit includes a first pass gate and a first receiver electrically coupled with the first pass gate. The first receiver includes a first N-type transistor. A first gate of the first N-type transistor is electrically coupled with the first pass gate. A first P-type bulk of the first N-type transistor is surrounded by a first N-type doped region. The first N-type doped region is surrounded by a first N-type well. The first N-type doped region has a dopant concentration higher than that of the first N-type well.

In a second embodiment, an integrated circuit includes a first pass gate and a first receiver electrically coupled with the first pass gate. The first receiver comprises a first N-type transistor. A first gate of the first N-type transistor is electrically coupled with the first pass gate. The first gate is configured to receive a first voltage. A first P-type bulk of the first N-type transistor is configured to receive a second voltage. A voltage difference between the first and second voltages is free from substantially overstressing a gate dielectric of the first N-type transistor.

In a third embodiment, a method of operating an integrated circuit including a high-side receiver and a low-side receiver. The high-side receiver includes an N-type transistor. A gate of the N-type transistor is electrically coupled with a pass gate. The method includes turning on the pass gate so as to electrically couple a first voltage from a pad to the gate of the N-type transistor. The method also includes electrically coupling a P-type bulk of the N-type transistor to a second voltage, wherein a voltage difference between the first and second voltages is free from substantially overstressing a gate dielectric of the N-type transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first pass gate; and
a first receiver electrically coupled with the first pass gate, the first receiver comprising a first N-type transistor, a first gate of the first N-type transistor being electrically coupled with the first pass gate, a first P-type bulk of the first N-type transistor being surrounded by a first N-type doped region, the first N-type doped region being surrounded by a first N-type well, the first N-type doped region having a dopant concentration higher than that of the first N-type well.

2. The integrated circuit of claim 1, wherein the first gate is configured to receive a first voltage, the first P-type bulk is configured to receive a second voltage, and a voltage difference between the first and second voltages is free from substantially overstressing a gate dielectric of the first N-type transistor.

3. The integrated circuit of claim 2, wherein a first source of the first N-type transistor is configured to receive a third voltage, and a voltage difference between the first and third voltages is free from substantially overstressing the gate dielectric of the first N-type transistor.

4. The integrated circuit of claim 1, wherein the first pass gate is a P-type transistor and electrically coupled with a pad, and a bulk of the P-type transistor is configured to receive a fourth voltage such that the bulk of the P-type transistor is free from being short to the pad.

5. The integrated circuit of claim 1, further comprising:
a second pass gate electrically coupled with the first pass gate; and
a second receiver electrically coupled with the second pass gate, wherein the first receiver is a high-side receiver and the second receiver is a low-side receiver.

6. The integrated circuit of claim 5, wherein the second receiver comprises a second N-type transistor, a second gate of the second N-type transistor is electrically coupled with the second pass gate, a second P-type bulk of the second N-type transistor is surrounded by a second N-type doped region, and the second N-type doped region is surrounded by a second N-type well.

7. The integrated circuit of claim 5, further comprising:
a third pass gate electrically coupled with the first receiver, wherein the first receiver further comprises a third N-type transistor, a third gate of the third N-type transistor is electrically coupled with the third pass gate, a third P-type bulk of the third N-type transistor is surrounded by a third N-type doped region, and the third N-type doped region is surrounded by a third N-type well; and a fourth pass gate electrically coupled with the second receiver.

8. The integrated circuit of claim 7, wherein the first pass gate is a first P-type transistor and electrically coupled with a first pad, the third pass gate is a second P-type transistor and electrically coupled with a second pad, a first N-type bulk of the first P-type transistor is configured to receive a fifth voltage such that the first N-type bulk is free from being short to the first pad, and a second N-type bulk of the second P-type transistor is configured to receive a sixth voltage such that the second N-type bulk is free from being short to the second pad.

9. An integrated circuit, comprising:
a first pass gate;
a first receiver electrically coupled with the first pass gate, the first receiver comprising a first N-type transistor, a first gate of the first N-type transistor being electrically coupled with the first pass gate, wherein the first gate is configured to receive a first voltage, a first P-type bulk of the first N-type transistor is configured to receive a second voltage, and a voltage difference between the first and second voltages is free from substantially overstressing a gate dielectric of the first N-type transistor;
a second pass gate electrically coupled with the first pass gate; and
a second receiver electrically coupled with the second pass gate, wherein the first receiver is a high-side receiver and the second receiver is a low-side receiver;
wherein the second receiver comprises a second N-type transistor, a second gate of the second N-type transistor is electrically coupled with the second pass gate, a second P-type bulk of the second N-type transistor is surrounded by a second N-type doped region, and the second N-type doped region is surrounded by a second N-type well.

10. The integrated circuit of claim 9, wherein the first N-type transistor further comprises a first N-type doped region around the first P-type bulk, the first N-type doped region is surrounded by a first N-type well, and the first N-type doped region has a dopant concentration higher than that of the first N-type well.

11. The integrated circuit of claim 10, wherein a first source of the first N-type transistor is configured to receive a third voltage, and a voltage difference between the first and third voltages is free from substantially overstressing the gate dielectric of the first N-type transistor.

12. The integrated circuit of claim 9, wherein the first pass gate is a P-type transistor and electrically coupled with a pad, and a bulk of the P-type transistor is configured to receive a fourth voltage such that the bulk of the P-type transistor is free from being short to the pad.

13. An integrated circuit, comprising:
a first pass gate;
a first receiver electrically coupled with the first pass gate, the first receiver comprising a first N-type transistor, a first gate of the first N-type transistor being electrically coupled with the first pass gate, wherein the first gate is configured to receive a first voltage, a first P-type bulk of the first N-type transistor is configured to receive a second voltage, and a voltage difference between the first and second voltages is free from substantially overstressing a gate dielectric of the first N-type transistor;
a second pass gate electrically coupled with the first pass gate;
a second receiver electrically coupled with the second pass gate, wherein the first receiver is a high-side receiver and the second receiver is a low-side receiver;
a third pass gate electrically coupled with the first receiver, wherein the first receiver further comprises a third N-type transistor, a third gate of the third N-type transistor is electrically coupled with the third pass gate, a third P-type bulk of the third N-type transistor is surrounded by a third N-type doped region, and the third N-type doped region is surrounded by a third N-type well; and
a fourth pass gate electrically coupled with the second receiver.

14. The integrated circuit of claim 13, wherein the first pass gate is a first P-type transistor and electrically coupled with a first pad, the third pass gate is a second P-type transistor and electrically coupled with a second pad, a first N-type bulk of the first P-type transistor is configured to receive a fifth voltage such that the first N-type bulk is free from being short to the first pad, and a second N-type bulk of the second P-type transistor is configured to receive a sixth voltage such that the second N-type bulk is free from being short to the second pad.

15. A method of operating an integrated circuit including a high-side receiver and a low-side receiver, the high-side receiver including an N-type transistor, a gate of the N-type transistor being electrically coupled with a pass gate, the method comprising:
turning on the pass gate so as to electrically couple a first voltage from a pad to the gate of the N-type transistor; and
electrically coupling a P-type bulk of the N-type transistor to a second voltage, wherein
the P-type bulk of the N-type transistor is surrounded by an N-type doped region, the N-type doped region surrounded by an N-type well, the N-type doped region having a dopant concentration higher than that of the N-type well, and
a voltage difference between the first and second voltages is free from substantially overstressing a gate dielectric of the N-type transistor.

16. The method of claim 15, wherein the second voltage is higher than 0 V.

17. The method of claim 15, further comprising:
electrically coupling a source of the N-type transistor to a third voltage, wherein the third voltage is higher than 0 V and a voltage difference between the first and third voltages is free from substantially overstressing the gate dielectric of the N-type transistor.

18. The method of claim 15, further comprising:
electrically coupling a bulk of the pass gate, which is a P-type transistor, to a fourth voltage, such that the bulk of the P-type transistor is free from being short to the pad.

* * * * *